United States Patent
Variot et al.

[11] Patent Number: 5,989,937
[45] Date of Patent: *Nov. 23, 1999

[54] METHOD FOR COMPENSATING FOR BOTTOM WARPAGE OF A BGA INTEGRATED CIRCUIT

[75] Inventors: Patrick Variot, San Jose; Chok J. Chia, Campbell; Robert T. Trabucco, Los Altos, all of Calif.

[73] Assignee: LSI Logic Corporation, Milpitas, Calif.

[*] Notice: This patent is subject to a terminal disclaimer.

[21] Appl. No.: 08/918,451

[22] Filed: Aug. 26, 1997

Related U.S. Application Data

[62] Division of application No. 08/506,382, Jul. 24, 1995, Pat. No. 5,745,986, which is a division of application No. 08/192,081, Feb. 4, 1994, Pat. No. 5,435,482.

[51] Int. Cl.$^6$ .................................................. H01L 21/44
[52] U.S. Cl. ........................... 438/108; 438/15; 438/118; 438/125; 438/126; 438/613
[58] Field of Search ..................................... 438/118, 125, 438/126, 15, 613, FOR 343; 29/827, 832, 840; 228/180.22; 361/768; 257/738

[56] References Cited

U.S. PATENT DOCUMENTS

| | | | |
|---|---|---|---|
| 2,366,935 | 1/1945 | Schmid | 451/388 |
| 3,833,230 | 9/1974 | Noll | 279/3 |
| 3,871,015 | 3/1975 | Lin et al. | 257/779 |
| 4,521,995 | 6/1985 | Sekiya | 451/388 |
| 4,603,466 | 8/1986 | Morley | 29/569 |
| 4,604,644 | 8/1986 | Beckman et al. | 257/737 |
| 4,661,192 | 4/1987 | McShane | 156/292 |
| 4,693,036 | 9/1987 | Mori | 451/287 |
| 4,752,027 | 6/1988 | Gschwend | 228/180.2 |
| 4,830,264 | 5/1989 | Bitaillou et al. | 228/180.2 |
| 5,010,389 | 4/1991 | Gansauge et al. | 257/737 |

(List continued on next page.)

FOREIGN PATENT DOCUMENTS

| | | |
|---|---|---|
| 59-188155 | 10/1984 | Japan . |
| 59-208766 | 11/1984 | Japan . |
| 61-159745 | 7/1986 | Japan . |
| 3-133136 | 6/1991 | Japan . |
| 3-171695 | 7/1991 | Japan . |
| 6-029659 | 2/1994 | Japan . |
| 87-01509 | 3/1977 | United Kingdom . |
| WO 89/02653 | 3/1989 | WIPO . |

OTHER PUBLICATIONS

IBM Technical Disclosure Bulletin, "Micro–Miniature Solder Flattening Assembly," vol. 31, No. 12, May 1989.

*Primary Examiner*—Olik Chaudhuri
*Assistant Examiner*—Alonzo Chambliss

[57] ABSTRACT

An integrated circuit includes a plurality of solder balls arrayed on the bottom surface of a package of the integrated circuit. These solder balls provide for surface mounting of the integrated circuit to a circuit board by solder reflow. The array of solder balls can be planarized so that each of the plural solder balls participate in defining a truly planar solder ball contact array for the integrated circuit package. Methods of manufacturing the integrated circuit with a package having planarized solder balls in an array dependent from a bottom surface thereof are set forth. The truly planarized solder ball contact array of the integrated circuit package affords nearly absolute reliability in forming of surface-mount electrical connections between the integrated circuit package and the circuit board on which the package is to mount. Additionally, the planarized solder ball contacts locally compensate individually for warpage of the integrated circuit package by variation in the individual dimensions of dependency of each solder ball below the bottom surface of the package.

9 Claims, 2 Drawing Sheets

U.S. PATENT DOCUMENTS

| | | | |
|---|---|---|---|
| 5,029,383 | 7/1991 | Snyder et al. | 29/740 |
| 5,060,844 | 10/1991 | Behun et al. | 228/180.2 |
| 5,121,299 | 6/1992 | Frankeny et al. | 361/413 |
| 5,167,361 | 12/1992 | Liebman et al. | 228/180.2 |
| 5,214,308 | 5/1993 | Nishiguchi et al. | 257/692 |
| 5,275,330 | 1/1994 | Isaacs et al. | 228/180.2 |
| 5,355,283 | 10/1994 | Marrs et al. | 361/760 |
| 5,400,950 | 3/1995 | Myers et al. | 228/180.2 |
| 5,435,482 | 7/1995 | Variot et al. | 228/254 |
| 5,461,261 | 10/1995 | Nishiguchi | 257/781 |
| 5,465,152 | 11/1995 | Bilodeau et al. | 356/371 |
| 5,489,750 | 2/1996 | Sakemi et al. | 174/261 |
| 5,745,986 | 5/1998 | Variot et al. | 29/840 |
| 5,901,437 | 5/1999 | Variot et al. | 29/840 |

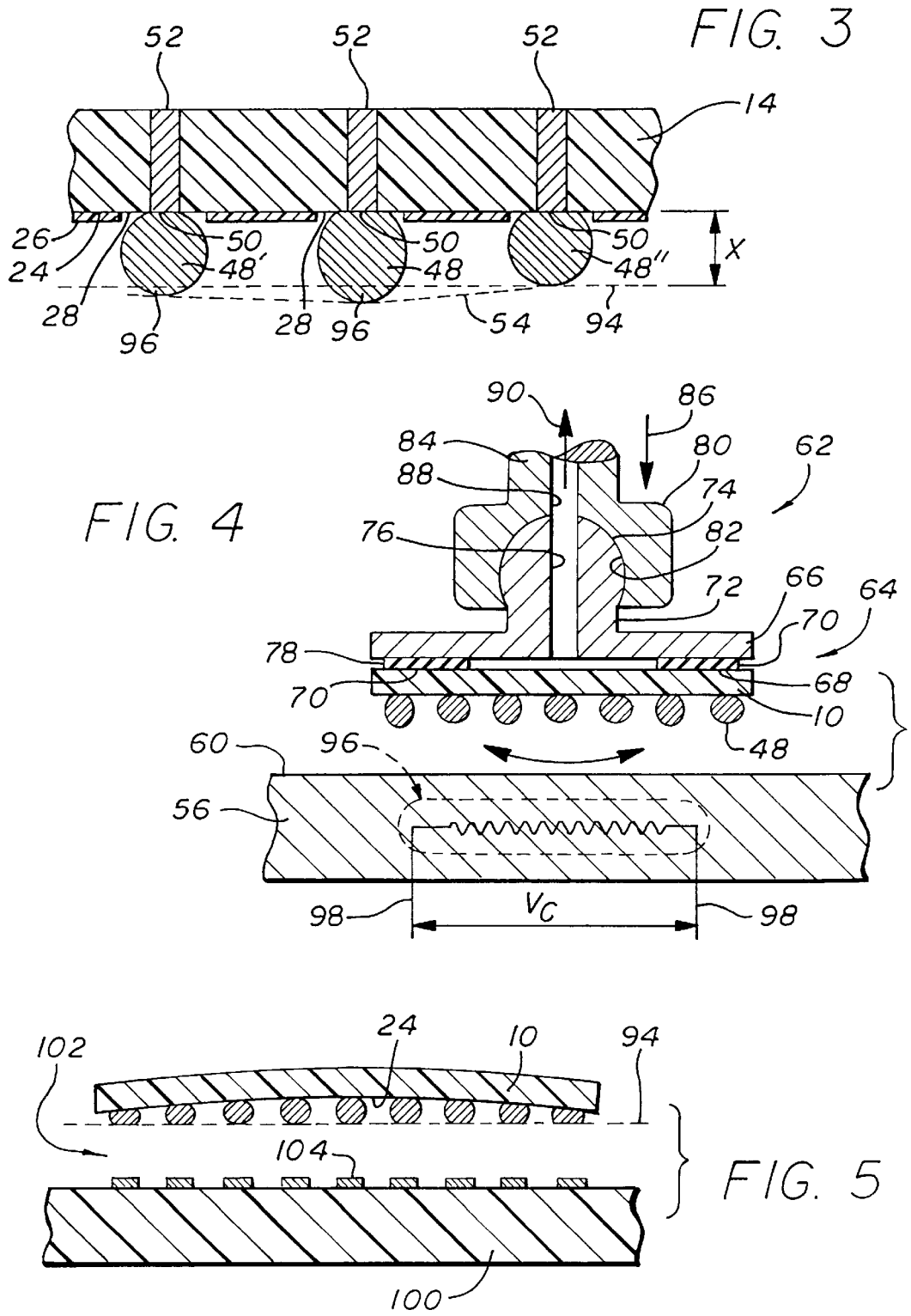

METHOD FOR COMPENSATING FOR BOTTOM WARPAGE OF A BGA INTEGRATED CIRCUIT

CROSS REFERENCE TO RELATED APPLICATIONS

This is a divisional of application Ser. No. 08/506,382, filed Jul. 24, 1995, now U.S. Pat. No. 5,745,986 which is a divisional of Ser. No. 08/192,081, filed Feb. 4, 1994, which issued as U.S. Pat. No. 5,435,482 on Jul. 25, 1995.

BACKGROUND OF THE INVENTION

1. Field of the Invention

The present invention is in the field of integrated circuits. More particularly, the present invention is in the field of integrated circuits of surface-mount technology type, having a package which houses the semiconductor chip and which provided electrical interface from this chip to plural electrical contacts disposed in an array on the bottom of the package. The chip is mounted to a circuit board, for example, by surface mounting its package in electrical connection with a congruent array of electrical contacts on the circuit board. Generally, a plurality of solder balls at the congruent contacts along with a solder reflow operation is used to both electrically connect the contacts of the integrated circuit package with the congruent contacts of the circuit board, and to physically mount the integrated circuit package on the circuit board.

2. Related Technology

Conventional surface-mount type of integrated circuits are known in which a ceramic package houses the integrated circuit, and which have a plurality of electrical contacts on the lower surface of the package. These electrical contacts are connected to congruent contacts of a circuit board by use of a corresponding plurality of solder balls depending from the contacts of the package. These solder balls are generally all of the same size. For example, the solder balls may be about 0.030 inches in diameter as set on the package bottom surface. The circuit board to which the package is to be mounted generally has a congruent array of electrical contacts at which a corresponding plurality of pads of solder paste (solder particles in paste flux) are applied. When the integrated circuit package is placed on the circuit board, the solder balls individually contact the pads of solder paste. Next, the circuit board and integrated circuit are placed in a solder reflow furnace, at a temperature and for a time sufficient to reflow the solder balls and to coalesce the solder particles of the solder paste into a unitary solder connection with the solder balls of the integrated circuit package.

Ceramic packages of the type described above generally are very stable and predictable dimensional. That is, the typical ceramic package may have an non-planarity of its bottom surface of no more than 0.001 to 0.002 inches across a typical package dimension of 1.125 to 1.5 inches square. Consequently, when the solder balls are placed on the bottom surface of such a package, they also define a mutual solder ball array plane which is non-planar by about the same amount as the package. That is, the solder balls themselves are generally made by a process similar to the making of buckshot, for example, which produces solder balls with a diameter dimension variation of no more than about +/−0.002 inches, or by a screen printing process using solder paste which is then reflowed to produce solder balls with a slightly higher degree of dimensional variability. With all of the conventional methods of making and placing the solder balls on a package bottom surface, the combination of package and solder ball dimensional variation creates an non-planarity of about 0.004 to 0.005 inches at most. The conventional furnace solder reflow mounting and electrical connection method described above will achieve reliable mounting and electrical connections with this degree of dimensional variation. Such reliability in the mounting and electrical connection of the integrated circuit packages to their mounting boards is important because the solder joints between the contacts of the package and those of the circuit board are highly difficult to visually inspect non-destructively once the package is in place on the circuit board. Statistical methods of quality control along with destructive testing methods must be relied upon to provide confidence in the good physical securing of any particular package to its circuit board along with reliable electrical connection of each of the package contacts to its corresponding contact of the circuit board.

Conventional surface-mount type of integrated circuit packages are also known which are fabricated of plastic rather than ceramic material. These plastic packages for integrated circuits are advantageously less expensive to manufacture, and have other advantages over the ceramic packages described above. However, the plastic integrated circuit packages also have serious disadvantage because the plastic material of these packages is not as dimensional stable as the more conventional ceramic material of the packages described above. That is, during the manufacture of these plastic packages, which is generally accomplished with an injection molding or plug molding type of manufacturing, the base portion of the package may warp out of planarity. That is, the base portion of the package which carries the depending solder balls may not be flat. If this base portion of the integrated circuit package is bowed or wavy, for example, then the solder balls depending from this surface will define cooperatively a solder ball contact array plane which is also bowed or wavy.

By careful consideration of the events taking place during the solder reflow operation to mount and electrically connect such a package to a circuit board, an appreciation of the problem outlined above may be gained. When an integrated circuit package with its depending array of solder balls is placed on a circuit board, which has been prepared with pads of solder paste (solder particles in flux) on the contacts of the circuit board, of the package and circuit board are sufficiently planar, than each of the solder balls will contact its corresponding pad of solder paste. Subsequently, when the circuit board and circuit package are heated in the solder reflow furnace, the reflowed solder balls and coalescing solder paste will join by mutual surface tension.

However, if the integrated circuit package is sufficiently bowed or wavy that some of the solder balls do not contact their corresponding solder paste contact pads, then mutual surface tension is not developed at these locations. When the solder paste and solder balls which are not contacting one another are reflowed, the surface tension of each tends to make them flatten but along their respective surfaces, and actually draw away from one another. Consequently, an electrical connection is generally not effected at the solder balls which do not contact their corresponding pads of solder paste. Also, the solder balls which do not electrically contact their corresponding circuit board contact do not participate in the physical securing of the package to the circuit board. Moreover, the physical mounting of the package to the circuit board is also compromised when solder balls do not join with their corresponding solder paste pads.

A contemporary plastic integrated circuit package may have a bottom surface non-planarity of about 0.004 inches.

When solder balls are added on this bottom surface, and contribute their own dimensional variability of 0.002 inches, or slightly more, then the total non-planarity to be expected at the solder ball array plane is at least 0.006 inches. This non-planarity is at the limit of what can be tolerated, and in fact statistically decreased the reliability of the electrical connections between such a package and a circuit board upon which it is to be mounted. In fact, a joint industry council, JEDEC, has proposed an industry standard for the planarity of the solder ball contact array at the bottom surface of plastic integrated circuit packages to address this problem. This standard calls for a non-planarity of no more than 0.006 inches.

SUMMARY OF THE INVENTION

In view of the deficiencies of current surface-mount technology integrated circuits, the present invention has as a primary object to provide such an integrated circuit housed in a package which has an array of dependent solder ball contacts in an array on the bottom surface of the package, and which solder balls cooperatively define a solder ball contact array plane of substantially perfect planarity.

More particularly, the present invention has as an object to provide such an integrated circuit with a plastic package which may be warped, for example, and not provide a perfectly planar surface on its bottom side, and yet which carries an array of solder ball contact members on its bottom side which cooperatively define a substantially planer solder ball contact array.

An additional object of the present invention is to provide a method of making such an integrated circuit.

Accordingly, the present invention provides an integrated circuit including a package housing an integrated circuit chip and providing for environmental protection of the circuit chip as well as electrical interface of the circuit chip with external electrical circuitry and physical mounting of the package to a circuit board, for example, and which package carries a dependent array of solder ball electrical contact members cooperatively defining a solder ball contact array plane of substantial planarity.

Still further, the present invention provides a method of making an integrated circuit including the steps of providing a plurality of solder ball contact members dependent from a bottom surface of a package of the integrated circuit to cooperatively define a solder ball contact array plane, and engaging at least some individual ones of said solder balls in said plurality of solder ball contacts with a planar member to make said solder ball contact array plane substantially planar.

Additional objects and advantages of the present invention will be apparent from a reading of the following detailed description of a single exemplary embodiment of the present invention; and of a method of making the integrated circuit including two alternative ways of planarizing the plurality of solder ball contacts cooperatively forming the solder ball contact array plane at the bottom surface of the integrated circuit, all taken in conjunction with the appended drawing Figures in which like reference numerals designate the same feature, or features which are analogous in structure or function.

BRIEF DESCRIPTION OF THE DRAWINGS

FIG. 3 is an enlarged fragmentary cross sectional elevation view of a portion of the integrated circuit seen in the preceding drawing figures, and illustrating a result of the manufacturing step depicted in FIG. 4;

FIG. 4 provides an enlarged elevation view of the integrated circuit package as it would appear at a particular stage of manufacture, and schematically depicts a manufacturing tool which is used at this stage of the manufacturing process; and FIG. 5 provides a schematic cross sectional elevation view of an integrated circuit according to the present invention preparatory to mounting and electrical connection of the integrated circuit to a circuit board.

DESCRIPTION OF THE PREFERRED EXEMPLARY

Embodiment of the Invention

Figure 1:
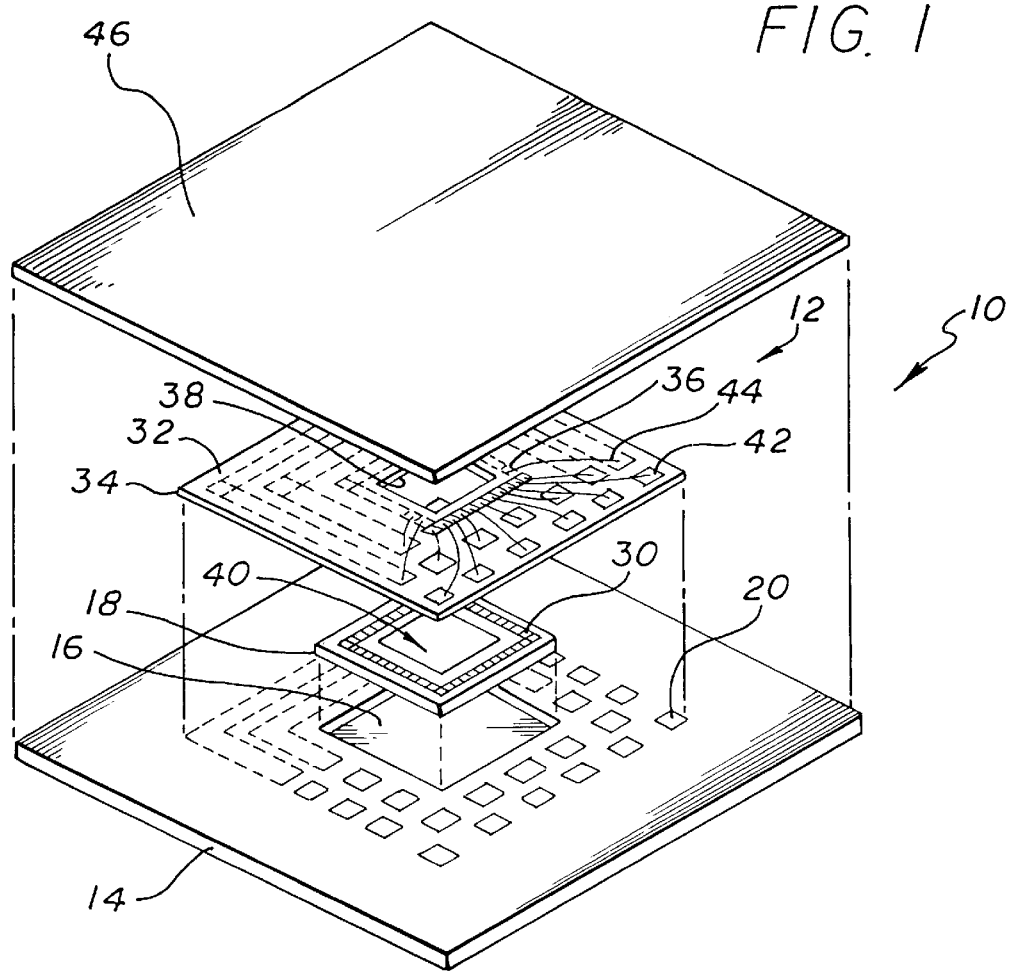
FIG. 1 is an exploded perspective view of a plastic package surface mount integrated circuit assembly with an integrated circuit chip and electrical interconnection (TAB) device.
Figure 2:
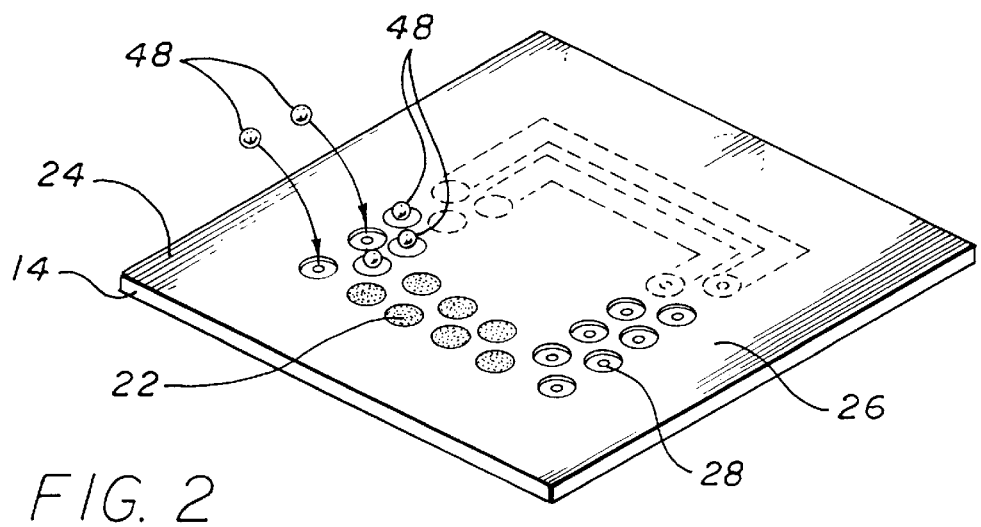
FIG. 2 is a view similar to FIG. 1, but showing the bottom surface of the integrated circuit package.

Viewing FIGS. 1 and 2 in conjunction, a surface-mount technology plastic-package ball-grid array integrated circuit assembly 10 is depicted in exploded view. The integrated circuit assembly 10 includes a two-part package, generally indicated with the numeral 12. This package 12 includes a base part member 14, which is a generally planar body of plastic material which is square in plan-form, and which defines a recess 16 into which an integrated circuit chip 18 is receivable. Surrounding the recess 16, the base member 14 carries a plurality of electrical contacts 20. These contacts 20 each individually connect electrically to corresponding ones of plural electrical contacts 22 disposed on the bottom surface 24 of the base member 14, also as is seen in FIG. 2. The electrical contacts 22 may be essentially flush with the bottom surface 24 of the package 12, or may protrude or be recessed slightly.

However, carried on the bottom surface 24 of the base member 14 is a film or coating of solder resist material 26. This solder resist material defines plural openings 28 corresponding to the plurality of contacts 22. In other words, each of the plural contacts 22 is disposed in a corresponding one of the plural openings 28, and is surrounded by the coating or film 26 of solder resist material to be separated from adjacent contacts by an interposed portion of the solder resist film or coating.

As will be seen, the package 12 receives the chip 18 into the recess 16, there to be secured by an adhesive material (not seen in the drawing Figures). Viewing FIG. 1, it is seen that the chip 18 includes plural peripherally-disposed fine-dimension electrical contacts, generally referenced with the numeral 30. Each of the individual contacts of the plurality of contacts 30 finds correspondence in an individual contact of the plurality 20. In order to effect electrical connection between the contacts 22 and 30, the integrated circuit assembly 10 includes a thin rectangular TAB (tape automated bonding) member 32. This TAB member 32 includes a thin film 34 which carries an array of electrical contacts 36 surrounding a central opening 38. This central opening 38 corresponds to the central active circuit area 40 of the integrated circuit chip 18. The arrangement of the contacts 36 matches that of the array of contacts 30 on the chip 18. Similarly, the film 34 carries a peripheral array of contacts 42 matching the array of contacts 20 on the base member 14. The contacts 36 and 42 are individually connected correspondingly with one another by a plurality of conductive traces 44 extending therebetween across the film 34. When the film 34 is placed congruently over the base 14 and integrated circuit chip 18 in recess 16, the contacts 36 connect with contacts 30, and contacts 42 connect with contacts 20. The film 34 is self-adhesive or is secured in place with a separate adhesive. The electrical connection of the contacts 36 and 42 of TAB 38 with the contacts of the chip and base member may be accomplished with simple surface-contact electrical conduction between these contacts, or may also be effected with a solder reflow step, for example. Alternatively, an ultrasonic pressure-bond process may be used to effect secure electrical connection between the TAB 32 and each of the circuit chip 18 and base part member 14. The use of TAB interconnection or electrical interfacing technology is well-known in the semiconductor integrated circuit packaging art.

Still viewing FIG. 1, it is seen that the package 12 includes a cover portion 46 which sealingly cooperates with the base part member 14 to provide a sealed and protected environment for the integrated circuit chip 18. During manufacturing of the integrated circuit assembly 10, the package cover portion 46 is sealingly attached to the base part member 14, for example, by use of a potting compound or epoxy. As a result, the integrated circuit chip 18 is environmentally protected once the manufacturing operations are completed to install the chip in the package 12 and to close this package. Alternatively, the cover portion 46 may be replaced with a simple layer of epoxy or other potting compound to provide environmental closure for the package 12, and for the integrated circuit chip 18 therein.

In order to provide for electrical connection and simultaneous physical mounting of the integrated circuit assembly 10 to a circuit board (seen in FIG. 5), the base part member 14 carries a plurality of solder ball electrical contact members 48, each disposed upon and electrically connecting to a corresponding one of the plural electrical contacts 22. FIG. 2 depicts that these solder ball members 48 may be formed as separate elements which are then placed into the openings 28 of solder resist film 26. The solder balls 48 may be secured by a solder reflow operation, for example, in which the material of the solder ball itself is melted to secure the ball to the contact 22. Alternatively, a layer of lower melting temperature solder may be provided in the openings on the contacts 22, and may be melted to secure the solder balls 48 without melting of these solder balls themselves. Still alternatively, solder paste (solder particles in a paste flux) may be screen printed onto the contacts 22 within the openings 28. This solder paste is then coalesced into a solder ball by furnace heating. Surface tension causes the solder material to stand up above the surrounding surface of the material 26 somewhat like a ball. Regardless of the method used to provide the depending protruding solder electrical contact members 48, these contact members 48 are herein referred to as solder "balls".

As will be further seen viewing FIG. 3, the electrical contacts 22 are defined by the end surface portions 50 of plural corresponding electrically conductive vias 52 extending through the material of the base part member 14 between the contact features 20 and the bottom surface 24 of this package base part member 14. The solder balls 48 secure to the contacts 22 (end surface portions 50) of vias 52 within the openings 28 of solder resist film 26. FIG. 3 further shows that the solder balls 48 individually may not each depend an equal distance (in the negative X direction) below the surface 24. That is, the two solder balls 48' in FIG. 3 may depend further below the surface 24 than does the other solder ball 48".

Additionally, when the entire plurality of solder balls 48 on the bottom surface 24 of the package 12 is considered, there may be a considerable non-planarity to a virtual surface or solder ball contact array plane 54 cooperatively defined by the solder balls 48. In part, this non-planarity of the contact array plane 54 is due to the non-uniform distance of dependance of the individual solder balls 48, and is also due to the possible warpage or waviness of the bottom surface 24 of the package 12 itself. The scale of FIG. 3 is such that this package warpage is not visible, but it may be easily envisioned by viewing the structure of FIGS. 1 and 2 and imagining the spherical, cylindrical, conical, or wavy, for example, distortions of this package structure at the surface 24 which could occur due to warpage and distortion of the plastic material of the package 12. Also, some non-planarity at the solder balls 48 may result from slight protrusions or recessing of the contact surface (end surface 50) of the vias 52 relative to the surface 24. This overall non-planarity of the contact array plane 54 is shown in FIG. 3 by the cranking of this plane or virtual surface over the center contact 48'.

In order to planarize the contact array plane 54, and provide a non-uniform dimension of dependence of the individual solder ball contacts 48 so as to locally compensate for any warpage of the package 12 at its bottom surface 24, the integrated circuit assembly 10 is touched to a planarizing tool 56 shown in FIG. 4. The planarizing tool 56 may take the form of a strong platen block which is supported so as to sustain forces applied thereto, as will be explained. This platen block 56 has a planar upper surface 60 which is strong and stable so as to provide a reference plane to which the plural solder balls of the solder ball contact array on the integrated circuit 10 will be matched.

A vacuum chuck pressing tool 62 is used to hold the integrated circuit assembly 10, and to forcefully engage this circuit assembly 10 with the surface 60 of platen 56. The vacuum chuck tool 62 includes a chuck member 64 with a foot portion 66 configured at a peripheral edge surface 68 to engage and support the integrated circuit assembly 10. A cushion 70 of yieldable material is interposed between the peripheral edge surface 68 and the integrated circuit assembly 10 to both form a vacuum seal and to yieldably support the integrated circuit package 12. A stem portion 72 extends upwardly from the foot portion 66 to a ball portion 74. These stem and ball portions 72 and 74 cooperatively define a through passage 76 communicating with a vacuum chamber 78 defined within the foot portion 66 cooperatively by the cushion member 70 and integrated circuit assembly 10.

A ball socket portion 80 of the chuck and pressing tool 62 defines a part spherical recess 82 movably but sealingly receiving the ball portion 74. A pressing ram 84 carries the ball socket portion 80 and is effective to move vertically and forcefully engage the integrated circuit 10 with the surface 60, as is indicated by arrow 86. Ram 84 and socket portion 80 cooperatively define a through passage 88 connecting with passage 76 to communicate chamber 78 with a source of vacuum, as indicated by arrow 90.

When the ram 84 is lowered to forcefully engage the integrated circuit 10 at its plurality of solder ball contacts 48 with the surface 60, the foot portion 66 may pivot on ball portion 74 (as depicted by arrow 92) to ensure uniform distribution of force over the area of the array of solder ball contact 48. As FIG. 3 depicts, the solder balls 48 may individually be deformed so that they cooperatively define a solder ball contact array plane 94 which is truly planar. In other words, solder ball contacts like those indicate with 48' at the left side of FIG. 3 will be distorted force the material indicated at 96 upwardly and to decrease their dimension of dependence from the surface 24. On the other hand, those solder balls like ball 48" at the right side of FIG. 3, which are somewhat more plump than the solder balls 48', and which do not depend as far even though containing substantially the same amount of solder, are substantially not changed by the pressing process. That is, the amount of force applied is chosen to be just sufficient to "flatten" the highest solder balls and bring the contact plane 94 to the highest level of the lowest of the solder balls 48. In this way, the solder balls 48 are also selectively distorted as needed to compensate locally for any warpage of the package 12. The net result is an integrated circuit assembly with a package 12 having a solder ball contact array of mutually coplanar solder balls. Because each individual solder ball 48 of the array is mutually coplanar in substantial effect with all of the other solder balls, all of the solder balls 48 participate at their point or area of maximum dependency from the surface 24 in defining the contact plane 94. That is, none of the solder balls 48 crosses the contact plane 94, and none of the solder balls is left out of or does not participate in defining the contact plane 94 because of not extending far enough from the surface 24, in substantial effect.

FIG. 4 also shown that the platen member 56 may be heated. That is the platen 56 may include a controlled heat source, for example, as is indicated by the schematic electrical resistance heating element 96. This heating element is connected by electrical leads 98 to a controlled voltage $V_c$ so that a precisely regulated temperature may be achieved at the surface 60 of the platen member 56. By selecting a temperature for platen 56 and a residence time during which the integrated circuit assembly 10 is in contact with the platen such that the solder balls 48 are locally softened but not liquified throughout their volume, the plural solder balls of the contact array may be planarized much as described above. The surface 60 of platen 56 must be such that the solder of solder balls 48 does not wet this surface. Thus, a planarized array of solder balls is achieved much as is depicted in FIG. 3. Advantageously, in this way the amount of force necessary to be applied to the package 12 of the integrated circuit 10 is greatly reduced. In fact, with the proper selection to temperature and residence time, the applied force may be minimal.

Attention now to FIG. 5 will quickly show how a great advantage is realized from the present invention. FIG. 5 shows an integrated circuit assembly 10 preparatory to its setting upon a circuit board 100 having thereon a plurality of electrical contacts (indicated generally with arrow 102), and each having a pad of solder paste 104 disposed thereon. The package 12 of integrated circuit 10 is seen to be bowed. If the solder balls 48 of this package were not planarized, only a few of the outer ones of these plural solder balls 48 would contact the pads 104 of solder paste and form mutual surface tension therewith. However, the central contacts where the electrical contacts would be absent would not be visible at all because they are near the center of the contact array.

Fortunately, the integrated circuit 10 has had its solder ball contacts 48 planarized according to the present invention. Consequently, the solder balls 48 cooperatively define a contact plane 94 which is truly planar in substantial effect. The planarized solder ball contacts 48 cooperatively define the contact plane 94, and also locally compensate by individual and various dimensions of dependency from the bottom surface 24 of the package 12 for any warpage of this package. Individual variations in the original dimensions of the solder balls 48 is also compensated. Thus, when the integrated circuit 10 is placed on the pads of solder paste 104, all of the solder ball contacts 48 engage with their corresponding one of the plural solder paste pads 104 and form a mutual surface tension therewith. When the circuit board 100 and integrated circuit 10 are placed in a solder reflow oven, the solder balls 48 and contacting solder paste pad 104 coalesce into a unitary solder connection between individual ones of the circuit board contacts 102 and corresponding ones of the contacts 22 of the integrated circuit package 12.

While the present invention has been depicted, described, and is defined by reference to particularly preferred embodiments of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

We claim:

1. A method of compensating for base member bottom surface warpage of a plastic package ball-grid array integrated circuit, comprising:

providing a reference plane surface for a plurality of solder ball electrical contact members depending downwardly from the base member bottom surface of the plastic package ball-grid array integrated circuit;

said plurality of solder ball electrical contact members defining a non-planar solder ball contact array plane;

heating said reference plane surface to a sufficient temperature to cause individual ones of said plurality of solder ball electrical contact members to locally soften but not to such a sufficient temperature to cause individual ones said plurality of solder ball electrical contact members to liquify throughout their volume when they engage said reference plane surface and are held in contact therewith for a residence time period;

bringing said plurality of solder ball members into engagement with said reference plane surface to apply a sufficient force to a highest solder ball member in said plurality of solder ball members to cause it to flatten when held in contact with said reference plane surface for said residence time period; and said sufficient force being only sufficient to bring said reference plane surface to a highest level of a lowest solder ball member in said plurality of solder ball members to selectively distort the solder ball members to compensate locally for any warpage in said plastic package ball-grid array integrated circuit.

2. A method of compensating for base member warpage of a plastic ball-grid array integrated circuit, comprising:

providing a reference plane surface for a plurality of electrical contacts on the integrated circuit;

bringing said plurality of contacts into engagement with said reference plane surface to cause at least one of the contacts to be flattened; and applying a sufficient force to said at least one of the contacts to flatten it so said reference plane surface is brought to the highest level of the lowest contact in said plurality of contacts to selectively distort the contact to compensate for any warpage in the plastic ball-grid array integrated circuit.

3. A method of compensating according to claim 2 wherein said contacts are plastically deformable contacts.

4. A method of compensating according to claim 2 wherein said contacts are solder balls deformable by applied heat.

5. A method of compensating according to claim 4 further comprising:

heating said reference plane surface to a sufficient temperature to cause individual ones of said plurality of solder ball electrical contact members to locally soften but not to such a sufficient temperature to cause individual ones said plurality of solder ball electrical contact members to liquify throughout their volume when they engage the heated reference plane surface and are held in contact therewith for a residence time period.

6. A method of compensating according to claim 5 wherein said step of bringing includes:

bringing said plurality of solder ball members into engagement with said reference plane surface to apply a sufficient force to a highest solder ball member in said plurality of solder ball members to cause it to flatten when held in contact with said reference plane surface for said residence time period.

7. A method of compensating according to claim 2 further comprising:

mounting the plastic ball-grid array integrated circuit in a chuck to align the bottom surface thereof with said reference plane surface; and moving said chuck toward said planar surface a sufficient distance to bring the contacts into proximate engagement with said reference plane surface.

8. A method of compensating according to claim 7 wherein:

said chuck is a vacuum chuck member; and wherein said step of bringing includes:

engaging said circuit with said vacuum chuck; and applying a vacuum to said vacuum chuck to releasably adhere said circuit thereto.

9. A method of compensating according to claim 8 wherein said step of engaging includes:

providing said vacuum chuck with a ball socket joint.

* * * * *